(12) United States Patent
Asayama et al.

(10) Patent No.: US 6,365,461 B1
(45) Date of Patent: Apr. 2, 2002

(54) METHOD OF MANUFACTURING EPITAXIAL WAFER

(75) Inventors: Eiichi Asayama, Saga; Shigeru Umeno, Sasebo; Masataka Hourai, Ogi-gun, all of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/679,888

(22) Filed: Oct. 5, 2000

(30) Foreign Application Priority Data

Oct. 7, 1999 (JP) ............................................. 11-286586

(51) Int. Cl.$^7$ .......................................... H01L 21/336
(52) U.S. Cl. ...................... 438/268; 438/238; 438/680; 437/10; 437/150; 117/84
(58) Field of Search ................................. 438/268, 238, 438/680; 437/10, 150; 117/84

(56) References Cited

U.S. PATENT DOCUMENTS

| | | | | |
|---|---|---|---|---|
| 5,389,551 A | * | 2/1995 | Kamakura et al. | ............ 437/10 |
| 5,637,145 A | * | 6/1997 | Miyanomae et al. | ......... 117/84 |

FOREIGN PATENT DOCUMENTS

| | | |
|---|---|---|
| EP | 0451855 A1 * | 10/1991 |
| JP | 60-251190 | 12/1985 |
| JP | 61-17495 | 1/1986 |
| JP | 05-294780 | 11/1993 |
| JP | 08-91993 | 4/1996 |
| JP | 10-98047 | 4/1998 |

* cited by examiner

Primary Examiner—Michael S. Lebentritt
Assistant Examiner—Pho Luu
(74) Attorney, Agent, or Firm—Armstrong, Westerman & Hattori, LLP

(57) ABSTRACT

Methods are designed to manufacture an epitaxial wafer wherein the formation of defects in an epitaxial layer is sufficiently suppressed even if the epitaxial wafer is prepared from a silicon single crystal which is grown while doped with nitrogen. Specifically, the methods are to grow an epitaxial layer on a wafer sliced from (1) a silicon single crystal wherein the oxygen concentration at an OSF ring region is $9 \times 10^{17}$ atoms/cm$^3$ or less, (2) a silicon single crystal wherein the inside diameter of an OSF ring region is located at a position which is 85% or more of the wafer diameter, and (3) a silicon single crystal doped with nitrogen at a concentration between $1 \times 10^{12}$ atoms/cm$^3$ or more and $1 \times 10^{14}$ atoms/cm$^3$ or less. Further, another method is to grow an epitaxial layer on (4) a wafer sliced from a silicon single crystal doped with nitrogen at a concentration between $1 \times 10^{12}$ atoms/cm$^3$ or more and less than $1 \times 10^{14}$ atoms/cm$^3$, the epitaxial layer being grown after the sliced wafer has been heat-treated at a temperature between 1200° C. and 1300° C. for 1 minute or more. According to the above methods, the density of defects in an epitaxial layer can be reduced to 0.1 piece/cm$^2$ or less.

20 Claims, 3 Drawing Sheets

METHOD OF MANUFACTURING EPITAXIAL WAFER

FIELD OF THE INVENTION

The present invention relates to a method of manufacturing an epitaxial wafer for use in semiconductor devices. More particularly, the invention is directed to a manufacturing method capable of suppressing the formation of defects such as stacking faults and dislocations in an epitaxial layer (hereinafter referred to as simply "defects in an epitaxial layer") when the epitaxial layer is grown on a wafer sliced from a silicon single crystal doped with nitrogen.

DESCRIPTION OF THE PRIOR ART

As the integration density of silicon semiconductor integrated circuit devices increases in recent years, a silicon wafer from which devices are formed is subjected to increasingly severe specifications. Since circuits are made finer with increasing integration density, in a device active region wherein a device is formed on a wafer, crystal defects such as dislocations and elemental metal impurities other than a dopant, which increase leakage current and shorten the life of a carrier are subjected to more rigorous limitations than ever before.

Conventionally, a wafer produced by slicing a silicon single crystal obtained through the Czochralski method has been used for a semiconductor device. Generally, this wafer contains oversaturated interstitial oxygen at a concentration of about $1 \times 10^{18}$ atoms/cm$^3$. Although oxygen is effective for enhancing the strength of a silicon wafer by preventing generation of dislocations and for providing a gettering effect, oxygen is well known to deposit in the form of an oxide and to induce crystal defects such as dislocations or stacking faults due to heating during production of a device.

However, in a process of device production, a so-called DZ layer (denuded zone) which is free of crystal defects and which has a thickness of about tens of $\mu$m is formed near the wafer surface by diffusion of oxygen to the outside, since the wafer is heat-treated at a temperature as high as 1100–1200° C. for several hours so as to form a field oxide film through LOCOS (Local Oxidation of Silicon) and a well diffusion layer. The DZ layer serves as a device active region, to thereby provide a reduction in crystal defects.

However, as higher density and larger integration are being called for in fabricating semiconductor devices, a high-energy ion implantation method is used to form a well, and when the device process is carried out at a low temperature equal to or lower than 1000° C., oxygen does not diffuse outward sufficiently and thus the satisfactory formation of a denuded zone near the surface is prevented. To overcome this inconvenience, attempts have been made to reduce oxygen content in a wafer, but such attempts have not been successful in perfectly suppressing crystal defects.

Under such circumstances, an epitaxial wafer wherein an epitaxial layer containing substantially no crystal defects is formed on a wafer has been developed and is widely used for highly integrated devices. However, even using such an epitaxial wafer exhibiting a high degree of crystallinity, device characteristics are degraded due to contamination of its epitaxial layer with elemental metal impurities during subsequent device process steps.

The epitaxial layer becomes more susceptible to contamination with elemental metal impurities as the degree of integration becomes higher and thus the process becomes more complicated, bringing about inconvenience that the influence of the contamination becomes graver. The contamination can be eliminated basically by cleaning a process environment and materials used. However, it is extremely difficult to make the device process completely free of contaminants, and thus gettering technology is required as a means for solving this problem. The gettering technology is a means for entrapping contaminant impurity elements entering an epitaxial layer in a region (sink) which is other than a device active region to make the contaminants harmless.

The gettering technology includes intrinsic gettering (hereinafter referred to as simply "IG") wherein impurity elements are entrapped by utilizing oxygen-caused oxide precipitates spontaneously induced during heat treatment in a device process. However, when a wafer is heat-treated at temperatures as high as 1050–1200 ° C. in an epitaxial step, oxide precipitate nuclei present within the wafer sliced from a silicon single crystal shrink and extinguish, thereby making it difficult to satisfactorily induce oxide precipitates which serve as a gettering source within the wafer in subsequent device process steps. As a consequence, even if the gettering technology is applied, a problem is addressed that a satisfactory IG effect cannot be exerted on metal impurities throughout the process.

To overcome this problem, the present inventors have made it possible to form oxide precipitate nuclei within a wafer by doping a single crystal with nitrogen while the crystal is grown. These oxide precipitate nuclei are hard to extinguish even with a high-temperature heat treatment during epitaxial step. That is, when a silicon single crystal is grown while doped with nitrogen, the thermal stability of oxide precipitate nuclei within the crystal is increased, whereby the oxide precipitate nuclei do not shrink or extinguish even if they are subjected to an epitaxial step Further, the oxide precipitate nuclei which remain present after the epitaxial step has been completed grow from the initial stage of the device process to effectively function as a gettering sink, and thus an IG effect can be expected.

However, as the study has made a progress, it has been found out that the thermally stable oxide precipitate nuclei, which are obtained by doping a crystal with nitrogen and which are hard to extinguish even after a high-temperature heat treatment, tend to easily induce defects in an epitaxial layer. When the stable oxide precipitate nuclei are induced near the wafer surface, defects, such as stacking faults and dislocations, tend to be easily induced in the epitaxial layer, i.e., a device active region, and thus these oxide precipitate nuclei impose the problem of increasing the leakage current and degrading the gate oxide integrity of a device.

SUMMARY OF THE INVENTION

The present invention has been made in view of the problem of defects in an epitaxial layer derived from nitrogen doping, and an object of the invention is therefore to provide a method of manufacturing an epitaxial wafer which is capable of sufficiently suppressing defects in the epitaxial layer to, e.g., 0.1 piece/cm$^2$ or less, even if the epitaxial wafer is prepared from a silicon single crystal grown while doped with nitrogen.

An oxidation-induced stacking fault (hereinafter referred to as simply "OSF") is one type of fine crystal defect attributed to contained oxygen. The OSF is a stacking fault formed in the crystal under an oxide film which is formed during a high-temperature oxidation treatment in a device process. The formation of OSF is positively correlated with the amount of oxygen in a crystal, and the OSF develops with oxide precipitates as nuclei. When a wafer sliced from a silicon single crystal grown by the Czochralski method is thermally oxidized at 1000–1200° C. for 1 to 20 hours, ring-like distributed oxidation-induced stacking faults (hereinafter referred to as "OSF ring") may sometimes occur around a single crystal pulling axis. The OSF ring is induced under a high-temperature heat treatment from nuclei of stable oxide precipitates which are hard to extinguish even at temperatures as high as 1100° C. or more. Even if an epitaxial layer is grown on a wafer containing an OSF ring, the nuclei of the OSF ring region remain unextinguished.

An OSF ring usually has a width of several millimeters to ten-odds millimeters and is sharply demarcated from other regions. The present inventors have verified from their study that the width of the OSF ring can be increased by doping a single crystal with nitrogen during its growth. Further, it has been verified that when the crystal is doped with nitrogen, the thermal stability of the oxide precipitate nuclei can be improved even in regions other than the OSF ring with these oxide precipitate nuclei being so stable as not to be easily shrinkable and extinguishable even after the epitaxial step. These stable oxide precipitate nuclei exhibit an IG effect from the initial stage of the device process as a gettering source.

As described previously, when the thermally stable oxide precipitate nuclei remain present in a region near the wafer surface, defects in an epitaxial layer tend to be easily induced. Defects in the epitaxial layer tend to occur frequently in regions near an OSF ring in a wafer although reasons therefor are not yet clear. Such defects in the epitaxial layer increase leakage current and degrade the gate oxide integrity of a device.

Further, through a detailed evaluation of the behavior of oxide precipitate nuclei obtained by doping a crystal with nitrogen and factors inducing defects in an epitaxial layer, it has been found out that the formation of defects in an epitaxial layer is influenced by factors such as nitrogen and oxygen concentrations in a crystal, pulling conditions for growing the crystal, and heat treatments before forming the epitaxial layer. That is, it has been found out that the OSF density which is responsible for causing defects in an epitaxial layer can be controlled by controlling the nitrogen and oxygen concentrations. Further, by controlling the location where an OSF ring occurs and the pull rate, and by heat-treating a wafer at high temperatures before growing an epitaxial layer, the size of the precipitate nuclei can be reduced to such a degree as not to induce defects in the epitaxial layer.

The present invention has been completed based on the above knowledge and views, and provides as a gist thereof the following methods (1) to (4) of manufacturing an epitaxial wafer:

(1) A method of manufacturing an epitaxial wafer wherein an epitaxial layer is grown on a wafer sliced from a silicon single crystal which is doped with nitrogen and which has an oxygen concentration of $9 \times 10^{17}$ atoms/cm$^3$ or less at an OSF ring region (hereinafter referred to as "first method").

(2) A method of manufacturing an epitaxial wafer wherein an epitaxial layer is grown on a wafer sliced from a silicon single crystal which is doped with nitrogen and which is grown in such a manner that an inside diameter of an OSF ring region is located at a position which is 85% or more of a diameter of the wafer (hereinafter referred to as "second method").

(3) A method of manufacturing an epitaxial wafer wherein an epitaxial layer is grown on a wafer sliced from a silicon single crystal which is doped with nitrogen at a concentration between $1 \times 10^{12}$ atoms/cm$^3$ or more and $1 \times 10^{14}$ atoms/cm$^3$ or less and which is grown at a pull rate of 1.2 mm/min or higher (hereinafter referred to as "third method").

(4) A method of manufacturing an epitaxial wafer wherein an epitaxial layer is grown on a wafer sliced from a silicon single crystal which is grown while doped with nitrogen at a concentration between $1 \times 10^{12}$ atoms/cm$^3$ or more and less than $1 \times 10^{14}$ atoms/cm$^3$, the epitaxial layer being grown after the sliced wafer has been heat-treated at a temperature between 1200° C. and 1300° C. for 1 minute or more (hereinafter referred to as "fourth method").

DESCRIPTION OF THE PREFERRED EMBODIMENTS

Figure 1:
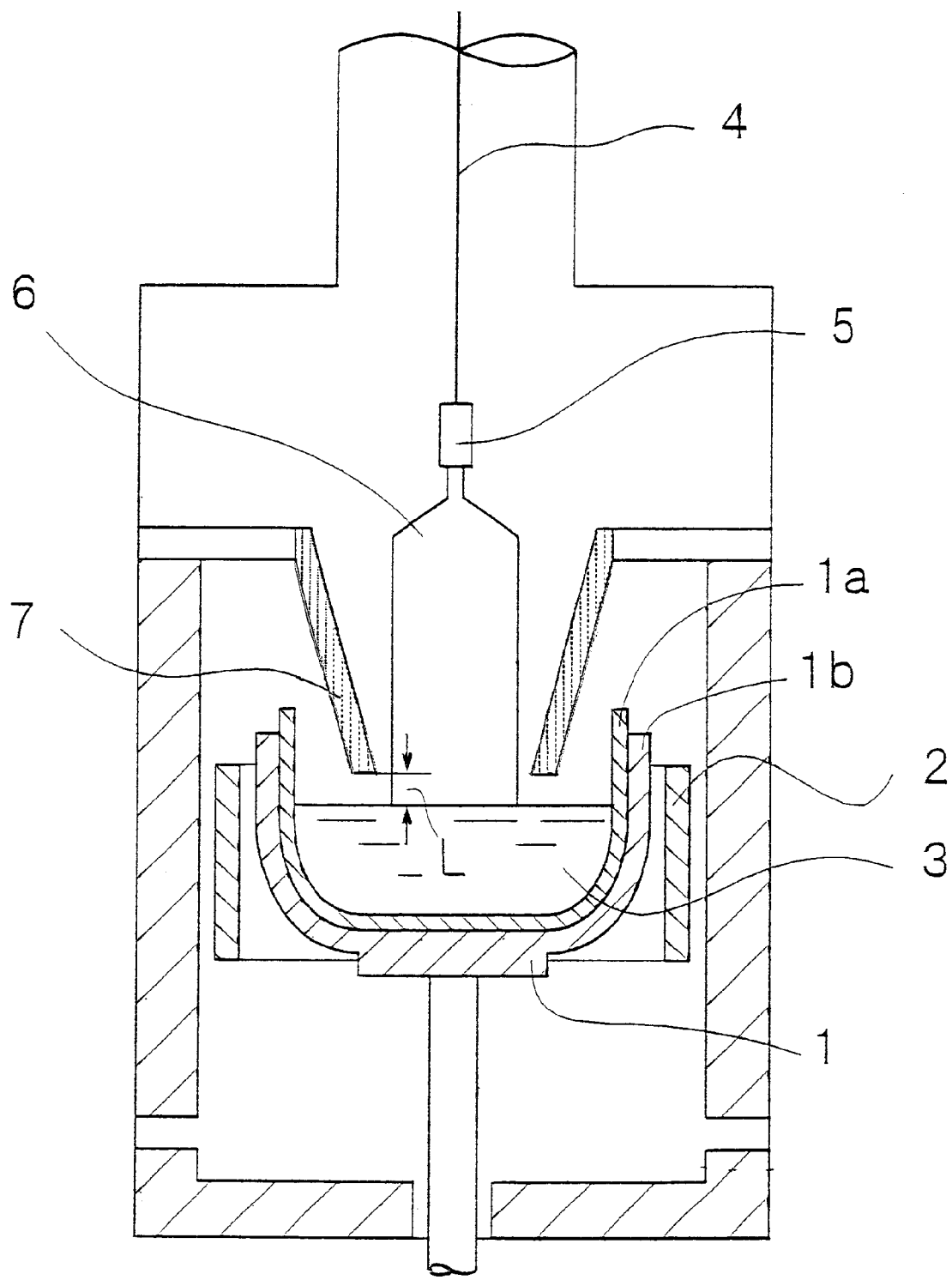
FIG. 1 is a diagram schematically illustrating the construction of an apparatus for growing a silicon single crystal used in embodiments of the present invention.

The reason why the oxygen concentration in an OSF ring region is specified to $9 \times 10^{17}$ atoms/cm$^3$ or less is that an oxygen concentration exceeding this value tends to induce defects in the epitaxial layer in the OSF ring region and that the formation of defects in the epitaxial layer can be avoided if the oxygen concentration can be reduced uniformly within an in-plane region of a wafer including the OSF ring region. Although the lower limit of oxygen concentration is not specified, it is preferable to specify the lower limit to $4 \times 10^{17}$ atoms/cm$^3$ or more from the viewpoint of securing oxide precipitation necessary to suppress reduction in wafer strength due to insufficient oxygen concentration and to obtain an IG effect.

No particular limitation is imposed on the method for doping so long as doping at predetermined concentrations of nitrogen can be performed. For example, a method of adding a nitride into a raw material or a melt, a method of adding nitrogen doped silicon crystal obtained through a floating zone (FZ) method into a raw material, a method of adding silicon nitride film-coated wafer into a raw material, a method of growing a single crystal in a furnace where nitrogen or a nitrogen compound gas flows, a method of spraying nitrogen or a nitrogen compound gas into a polycrystalline silicon at a high temperature before melting, or a method of using a crucible produced from a nitride are available.

To grow an epitaxial layer, the above-described nitrogen-doped single crystal is sliced into a wafer, and an epitaxial layer is grown on the wafer after the wafer surface has been polished and cleaned. To form the epitaxial layer, any method may be used as long as the epitaxial layer is free of crystal defects. For example, a thermal decomposition method for vapor phase growth may be used.

In the second manufacturing method, it is required that the inside diameter of an OSF ring region is located at a position which is 85% or more of the diameter of a wafer. Since the OSF ring appears in the form of a ring around the pulling axis as described previously, the location where the OSF ring is formed is indicated in terms of percentage (%) with respect to the diameter of a wafer or in terms of a distance from the center of a wafer using the inside diameter of the ring as a reference. In terms of percentage (%) with respect to the wafer diameter, the wafer center is expressed as 0%, and the outer edge of the wafer as 100%.

Since defects in an epitaxial layer usually occur slightly outside the location where an OSF ring occurs, the further outward these defects occur, the better the device characteristics, and the better the yield of the wafer. From this viewpoint, the limit within which an OSF ring is allowed to exist is set to 85% of the diameter of a wafer using the inside diameter of the OSF ring as a reference.

On the other hand, the outer edge portion of the wafer is not usable as a device and hence is scrapped. Thus, it is effective to pull a single crystal so that the crystal being grown has a diameter larger than a diameter of the same crystal finished as a product in order to drive an OSF ring out into an increased diameter portion of the wafer. With this arrangement, the OSF ring region can be removed from the wafer surface when the wafer is rounded to a perfect circle.

In the third manufacturing method, a single crystal to be grown is supposed to be doped with nitrogen at a concentration between $1 \times 10^{12}$ atoms/cm$^3$ or more and $1 \times 10^{14}$ atoms/cm$^3$ or less. The lower limit of nitrogen concentration specified to $1 \times 10^{12}$ atoms/cm$^3$ is because concentrations lower than this value prevent a predetermined IG effect from being obtained. Further, its upper limit is specified to $1 \times 10^{14}$ atoms/cm$^3$ because concentrations higher than this value allow thermally stable oxide precipitate nuclei to be formed near the wafer surface and hence defects in an epitaxial layer tend to be easily induced with these as nuclei. However, from the viewpoint of keeping the density of defects in the epitaxial layer at 0.1 piece/cm$^2$ or less, it is further preferable to set the nitrogen concentration to less than $1 \times 10^{13}$ atoms/cm$^3$.

The pull rate is specified to 1.2 mm/min or higher in order to reduce the oxide precipitate nuclei formed within the single crystal. Under this condition, the formation of defects in the epitaxial layer can be suppressed.

The nitrogen concentration in the crystal is calculated from the amount of nitrogen doped in silicon before pulling, the distribution coefficient of nitrogen in a silicon melt and a solid, and the degree of solidification ratio of the crystal. That is, the initial concentration of nitrogen in silicon $C_0$ is calculated from the amount of silicon atoms in a raw material and the amount of nitrogen atoms added, and the concentration of nitrogen in the crystal $C_N$ is calculated by use of the following equation (a):

$$C_N = C_0 k (1-x)^{k-1} \tag{a}$$

wherein k is the equilibrium segregation coefficient, which is $7 \times 10^{-4}$, and x is the solidification ratio, which is expressed by the weight of the pulled portion of a crystal divided by an initial charge weight.

In the fourth manufacturing method also, a single crystal to be grown is supposed to be doped with nitrogen at a concentration between $1 \times 10^{12}$ atoms/cm$^3$ or more and less than $1 \times 10^{14}$ atoms/cm$^3$. The lower and upper limits are so specified for the same reason as in the above-described third manufacturing method. However, from the viewpoint of keeping the density of defects in an epitaxial layer at 0.1 piece/cm$^2$ or less, it is preferable to set the nitrogen concentration to less than $1 \times 10^{13}$ atoms/cm$^3$.

As shown in Example 3 which will be described later, when a wafer is subjected to a heat treatment before growing an epitaxial layer thereon, an effect that the density of defects in the epitaxial layer is decreased is obtained. The higher the temperature and the longer the duration of the heat treatment, the better the effect. Considering nitrogen concentrations for doping, it was determined to give the heat treatment within a temperature range of 1200–1300° C. for 1 minute or more.

EXAMPLES

To verify the effects obtained from the first to fourth manufacturing methods of the present invention, tests were conducted based on the following Examples 1 to 3.

FIG. 1 is a diagram schematically illustrating the construction of an apparatus for growing a silicon single crystal used in the Examples. A crucible 1 is located at the center of the apparatus. The crucible 1 is comprised of a quartz container 1a and a graphite container 1b fitted around the container 1a. A heater 2 is concentrically arranged outside the crucible 1. A melt 3 molten by the heater 2 is contained within the crucible 1. Above the crucible 1 is a pull shaft 4, which is suspended so as to be rotatable and vertically movable. A seed crystal 5 is attached to the pull shaft 4. A single crystal 6 is grown from the lower end of the seed crystal 5. A heat shielding material 7 is arranged so as to surround the growing single crystal 6, and the distance between the surface of the melt 3 and the lower end of the heat shielding material 7 is controlled as a gap L.

Example 1

In Example 1, to verify the effects of the second and third manufacturing methods, an 8 inch diameter p-type (100) silicon single crystal was grown using the above-described growing apparatus at a crystal rotating speed of 20 rpm. The single crystal was grown with the nitrogen concentration, oxygen concentration, boron concentration, pull rate, and gap L between the melt surface and the heat shielding material varied. The specific conditions for this growth are shown in Table 1.

TABLE 1

| Sample Level | Nitrogen Concentration (atoms/cm$^3$) | Oxygen Concentration (atoms/cm$^3$) | Boron Concentration (atoms/cm$^3$) | Pull Rate (mm/min) | Gap L (mm) |
|---|---|---|---|---|---|
| Sample 1 | $2 \times 10^{15}$ | $15 \times 10^{17}$ | $1 \times 10^{16}$ | 0.9 | 10 |
| Sample 2 | $2 \times 10^{15}$ | $15 \times 10^{17}$ | $1 \times 10^{16}$ | 1.2 | 10 |
| Sample 3 | $2 \times 10^{15}$ | $15 \times 10^{17}$ | $1 \times 10^{16}$ | 1.8 | 10 |
| Sample 4 | $1 \times 10^{14}$ | $15 \times 10^{17}$ | $1 \times 10^{16}$ | 0.9 | 10 |
| Sample 5 | $1 \times 10^{14}$ | $15 \times 10^{17}$ | $1 \times 10^{16}$ | 1.2 | 10 |
| Sample 6 | $1 \times 10^{14}$ | $15 \times 10^{17}$ | $1 \times 10^{16}$ | 1.8 | 10 |
| Sample 7 | $9 \times 10^{12}$ | $15 \times 10^{17}$ | $1 \times 10^{16}$ | 0.9 | 10 |
| Sample 8 | $9 \times 10^{12}$ | $15 \times 10^{17}$ | $1 \times 10^{16}$ | 1.2 | 10 |
| Sample 9 | $9 \times 10^{12}$ | $15 \times 10^{17}$ | $1 \times 10^{16}$ | 1.8 | 10 |
| Sample 10 | $1 \times 10^{14}$ | $15 \times 10^{17}$ | $1 \times 10^{18}$ | 0.9 | 10 |
| Sample 11 | $1 \times 10^{14}$ | $15 \times 10^{17}$ | $1 \times 10^{18}$ | 1.8 | 10 |
| Sample 12 | $9 \times 10^{12}$ | $15 \times 10^{17}$ | $1 \times 10^{18}$ | 0.9 | 10 |
| Sample 13 | $9 \times 10^{12}$ | $15 \times 10^{17}$ | $1 \times 10^{18}$ | 1.8 | 10 |
| Sample 14 | $2 \times 10^{15}$ | $15 \times 10^{17}$ | $1 \times 10^{16}$ | 0.9 | 20 |
| Sample 15 | $2 \times 10^{15}$ | $15 \times 10^{17}$ | $1 \times 10^{16}$ | 0.9 | 30 |

Wafers were sliced from the grown single crystal, and the sliced wafers were heat-treated at a high temperature of 1100° C. in an oxygen atmosphere for 16 hours as a heat treatment for OSF density evaluation. The obtained wafer samples were selectively etched for 5 minutes using a Wright etchant, and the OSF density was counted using an optical microscope to determine the location where an OSF ring occurred based on the distance (mm) from the wafer center using the inside diameter of the ring as a reference. Then, an epitaxial layer was grown on each of wafers sliced from positions near these wafers to a thickness of about 5 μm at a deposition temperature of 1150° C., and the density of defects in each of the formed epitaxial layers was measured using a commercially available surface defect measuring apparatus. The determination and measurement results are shown in Table 2, wherein "Location Where OSF Ring Occurred" is indicated by the distance (mm) from the wafer center using the inside diameter of the ring as a reference. Since 8 inch diameter sample wafers (whose radius is 101.6 mm) were used, a value indicating a distance (mm) is substantially equal to a percentage (%) with respect to the wafer diameter.

TABLE 2

| Sample Level | Location Where OSF Ring Occurred (mm) | Density of Defects in an Epitaxial Layer (piece/cm$^2$) |
| --- | --- | --- |
| Sample 1 | 50 | 4.23 |
| Sample 2 | 70 | 1.01 |
| Sample 3 | 80 | 0.30 |
| Sample 4 | 50 | 1.23 |
| Sample 5 | 70 | 0.78 |
| Sample 6 | 80 | 0.11 |
| Sample 7 | 50 | 0.23 |
| Sample 8 | 70 | 0.09 |
| Sample 9 | 80 | 0.07 |
| Sample 10 | 40 | 71.00 |
| Sample 11 | 70 | 0.35 |
| Sample 12 | 40 | 15.00 |
| Sample 13 | 70 | 0.14 |
| Sample 14 | 80 | 4.10 |
| Sample 15 | 85 | 0.10 |

Samples 1 to 3 in Tables 1 and 2 were sliced from the single crystal which was being pulled at rates varied between 0.9 mm/min and 1.8 mm/min. By increasing the pull rate, the location where the OSF ring occurred was moved toward the outer edge, and in association therewith, the density of defects in the epitaxial layer was decreased. The reason therefor is that as the pull rate was increased, the size of the precipitate nuclei reduced, to thereby make it hard to induce defects in the epitaxial layer.

Samples 4 to 6 show the results when the nitrogen concentration was $1 \times 10^{14}$ atoms/cm$^3$, and samples 7 to 9 show the results when the nitrogen concentration was $9 \times 10^{12}$ atoms/cm$^3$. It is understood that a decrease in the nitrogen concentration decreases the density of defects in an epitaxial layer. For example, when the nitrogen concentration is as low as $9 \times 10^{12}$ atoms/cm$^3$, the density of defects in an epitaxial layer can be reduced to 0.1 piece/cm$^2$ or less when the single crystal was pulled at a rate of 1.2 mm/min (Samples 8 and 9). On the other hand, even if the nitrogen concentration is set to a relatively high value of $1 \times 10^{14}$ atoms/cm$^3$, by increasing the pull rate to 1.8 mm/min, the density of defects in an epitaxial layer can be reduced to the order of 0.1 piece/cm$^2$ (Sample 6).

However, when the nitrogen concentration is excessively decreased, a predetermined IG effect cannot be obtained, and thus a concentration of $10^{12}$ atoms/cm$^3$ or more is required to be achieved. Further, when the nitrogen concentration is made higher than $1 \times 10^{14}$ atoms/cm$^3$, defects in an epitaxial layer cannot be suppressed even if the pull rate is increased. Thus, the nitrogen concentration is required to be $1 \times 10^{14}$ atoms/cm$^3$ or less. However, as shown by Samples 14 and 15 which will be described later, if, e.g., a wafer wherein the inside diameter of an OSF ring region is located at a position which is 85% or more of the diameter of the wafer by expanding the gap L is used, the density of defects in an epitaxial layer can be reduced.

Samples 10 to 13 show the results of cases wherein the boron concentration is higher than others. From these results, it is understood that defects in an epitaxial layer tend to be easily induced when the boron concentration becomes as high as $1 \times 10^{18}$ atoms/cm$^3$. This is because addition of boron promoted formation and growth of oxide precipitate nuclei. Even when the boron concentration is high, if the nitrogen concentration is reduced and the pull rate is increased, defects in an epitaxial layer can be reduced (Sample 13).

Samples 14 and 15 show the influence of an increased gap L between the melt surface and the lower end of the heat shielding material exerted on the location where an OSF ring occurred. It is found out that the location where the OSF ring occurred moved outward as the gap L increased.

Defects in an epitaxial layer usually occur slightly outside a region where an OSF ring occurred. When this is considered, the further outward the OSF ring region, the larger the wafer area usable as a device chip, and the better the quality of the epitaxial layer. When the OSF ring is located at a position, in terms of its inside diameter, which is 85 mm or more from the wafer center, the density of defects in an epitaxial layer is sufficiently reduced (Sample 15).

The OSF ring region is indicated by the distance (mm) from the wafer center in Table 2. Since the 8 inch diameter wafers were used as samples (whose radius is 101.6 mm), a value indicating the distance (mm) between the OSF ring region and the wafer center can be used as a value indicating the percentage (%) of the OSF ring region with respect to the wafer diameter as noted with reference to the second manufacturing method.

Example 2

In Example 2, to verify the effect of the first manufacturing method, how in-plane oxygen distributions influence the formation of defects in an epitaxial layer was examined. Two 8 inch diameter p-type (100) single crystals were grown under the condition that each has a nitrogen concentration of $2 \times 10^{15}$ atoms/cm$^3$ and an oxygen concentration of $12 \times 10^{17}$ atoms/cm$^3$. During growth, one of the crystals was rotated at a speed of 20 rpm and the other at a speed of 10 rpm, and the gap L was set to 20 mm for both crystals.

Wafers, which were sliced from the grown crystals, were heat-treated at 1100° C. in an oxygen atmosphere for 16 hours. Samples prepared from the obtained wafers were examined to check oxygen concentration distributions in their in-plane areas through infrared absorption measurement. For oxygen concentration conversion coefficients, the old-ASTM 1979 was used. Then, the samples were selectively etched for 5 minutes using the Wright etchant, and the OSF density was counted using the optical microscope. Epitaxial films, each having a thickness of about 5 μm, were grown on wafers at a deposition temperature of 1150° C., respectively, the wafers being sliced from a location near the location where the above sampled wafers were sliced. Then, the densities of defects in an epitaxial layer were measured using the commercially available surface defect measuring apparatus.

Figure 2:
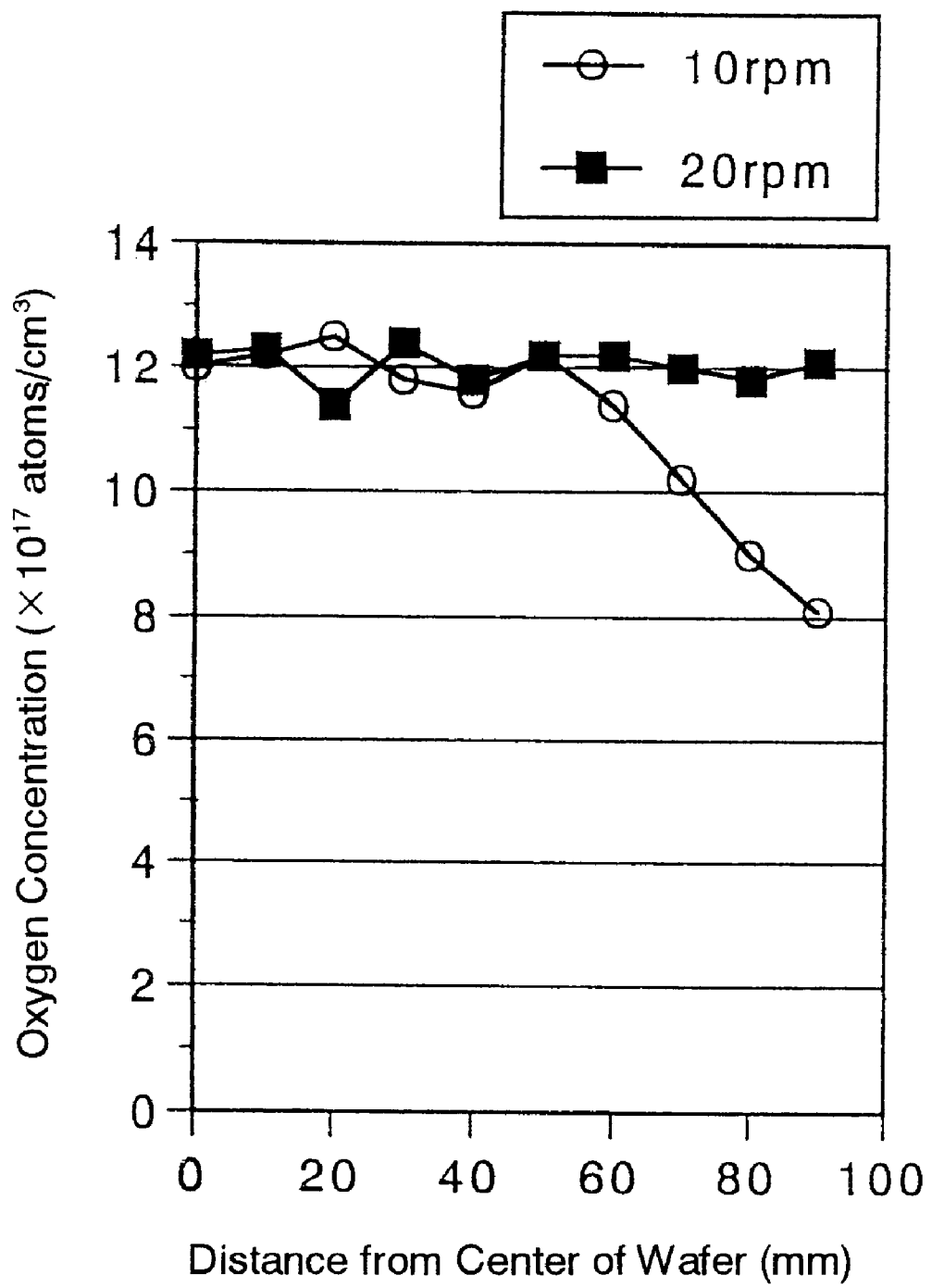
FIG. 2 is a diagram showing oxygen concentration distributions within in-plane areas of wafers sliced from a single crystal.

FIG. 2 is a diagram showing oxygen concentration distributions in in-plane areas of the wafers sliced from the single crystals. It is understood from this figure that when the crystal rotating speed is as low as 10 rpm, the oxygen concentration is reduced to 8–10×10$^{17}$ atoms/cm$^3$ around the outer edge portion.

Figure 3:
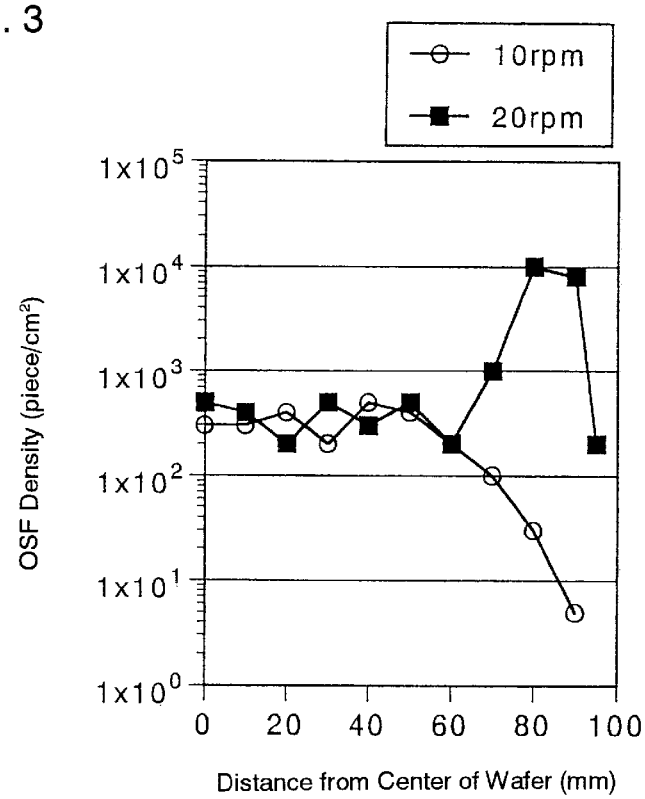
FIG. 3 is a diagram showing measurement results of in-plane OSF density distributions after the same wafers as those of FIG. 2 have been thermally oxidized at 1100° C. for 16 hours.

FIG. 3 is a diagram showing the measurement results of OSF density distributions in in-plane areas of the same wafers as those of FIG. 2 after the wafers were heat-treated at 1100° C. for 16 hours. It is understood that the wafer obtained from the crystal rotated at a higher speed of 20 rpm has an OSF ring formed at a distance of 80 mm from the wafer center. On the other hand, the wafer obtained from the crystal rotated at the lower speed exhibits a reduction in OSF density in an in-plane area which is closer to the outer edge, with no OSF ring observed.

Figure 4:
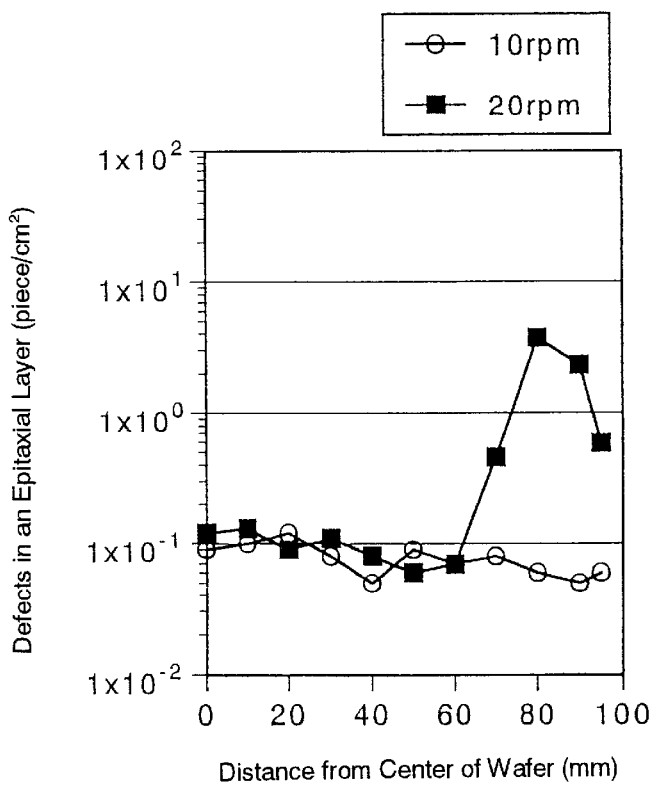
FIG. 4 is a diagram showing density distributions of defects in epitaxial layers within in-plane areas of wafers.

FIG. 4 is a diagram showing density distributions as to defects in epitaxial layers. It is apparent from this figure that the epitaxial wafer prepared from the wafer grown at the higher crystal rotating speed exhibits defects in its epitaxial layer at a location closely correlated to the location where the OSF ring occurs, while the epitaxial wafer prepared from the wafer grown at the lower crystal rotating speed exhibits no peak of defects in its epitaxial layer.

To summarize the results shown in FIGS. 2 to 4, formation of defects in an epitaxial layer is suppressed when the oxygen concentration is as low as 9×10$^{17}$ atoms/cm$^3$ or less at the location where an OSF ring occur, as in the case of FIG. 2 where the crystal rotating speed is low, against the expectation that when oxygen concentrations are distributed uniformly in an in-plane area of a wafer, an OSF ring should be formed at a distance of 80 mm from the wafer center. Therefore, in the OSF ring region where defects in an epitaxial layer tend to be easily induced, it is an effective means for reducing the density of defects in an epitaxial layer to reduce the oxygen concentration to 9×10$^{17}$ atoms/cm$^3$ or less.

Example 3

In Example 3, to verify the effect obtained from the fourth method, techniques were studied for reducing the density of defects in an epitaxial layer by heat-treating a wafer. First, an 8 inch diameter p-type (100) single crystal was grown under the condition that the oxygen concentration is 12×10$^{17}$ atoms/cm$^3$, the boron concentration 1×10$^{17}$ atoms/cm$^3$, and the crystal rotating speed is 20 rpm while varying the nitrogen concentration within the crystal at two levels, which are 1×10$^{14}$ atoms/cm$^3$ and 9×10$^{12}$ atoms/cm$^3$.

Each of wafers sliced from the grown crystal was subjected to a pretreatment at various temperatures for various durations before epitaxial layers were grown. After the pretreatment, an epitaxial layer having a thickness of about 5 μm was grown at a deposition temperature of 1150° C. on each wafer. Then, the density of defects in each epitaxial layer was measured using a commercially available surface defect detecting apparatus. The results are shown in Table 3.

TABLE 3

| Sample Level | Nitrogen Concentration (atoms/cm$^3$) | Treatment Before Growth of Epitaxial Layer | | Density of Defects in an Epitaxial Layer (piece/cm$^2$) |
| --- | --- | --- | --- | --- |
| | | Temperature (° C.) | Time (sec) | |
| Sample 16 | 1 × 10$^{14}$ | 1100 | 20 | 2.03 |
| Sample 17 | 1 × 10$^{14}$ | 1100 | 3600 | 1.52 |

TABLE 3-continued

| Sample Level | Nitrogen Concentration (atoms/cm$^3$) | Treatment Before Growth of Epitaxial Layer | | Density of Defects in an Epitaxial Layer (piece/cm$^2$) |
| --- | --- | --- | --- | --- |
| | | Temperature (° C.) | Time (sec) | |
| Sample 18 | 1 × 10$^{14}$ | 1150 | 20 | 0.71 |
| Sample 19 | 1 × 10$^{14}$ | 1150 | 60 | 0.53 |
| Sample 20 | 1 × 10$^{14}$ | 1150 | 3600 | 0.39 |
| Sample 21 | 1 × 10$^{14}$ | 1200 | 20 | 0.30 |
| Sample 22 | 1 × 10$^{14}$ | 1200 | 60 | 0.10 |
| Sample 23 | 1 × 10$^{14}$ | 1200 | 3600 | 0.07 |
| Sample 24 | 9 × 10$^{12}$ | 1100 | 20 | 1.38 |
| Sample 25 | 9 × 10$^{12}$ | 1100 | 3600 | 0.58 |
| Sample 26 | 9 × 10$^{12}$ | 1150 | 20 | 0.35 |
| Sample 27 | 9 × 10$^{12}$ | 1150 | 60 | 0.10 |
| Sample 28 | 9 × 10$^{12}$ | 1150 | 3600 | 0.08 |
| Sample 29 | 9 × 10$^{12}$ | 1200 | 20 | 0.10 |
| Sample 30 | 9 × 10$^{12}$ | 1200 | 60 | 0.08 |
| Sample 31 | 9 × 10$^{12}$ | 1200 | 3600 | 0.04 |

It is understood from the results shown in Table 3 that the higher and longer the pretreatment temperature and time (Sample 23) and further the lower the nitrogen concentration, the lower the density of defects in an epitaxial layer (Samples 30 and 31). Therefore, by heat-treating a wafer at 1200° C. or higher for 1 minute or more before growing an epitaxial layer thereon, the density of defects in an epitaxial layer can be reduced to the order of 0.1 piece/cm$^2$, and hence it is an effective means for reducing the density of defects in an epitaxial layer to increase the temperature and duration of the pretreatment.

As described in the foregoing, according to the methods of manufacturing an epitaxial wafer of the present invention, even if a wafer is prepared from a silicon single crystal which is grown while doped with nitrogen, the epitaxial wafer wherein formation of defects in an epitaxial layer is sufficiently suppressed and wherein the density of such defects is, e.g., 0.1 piece/cm$^2$ or less can be manufactured.

What is claimed is:

1. A method of manufacturing an epitaxial wafer comprising a step of growing an epitaxial layer on a wafer sliced from a silicon single crystal which is doped with nitrogen and which has an oxygen concentration of 9×10$^{17}$ atoms/cm$^3$ or less at an oxygen induced stacking fault ring region.

2. A method of manufacturing an epitaxial wafer according to claim 1, wherein said oxygen concentration in said wafer is 4×10$^{17}$ atoms/cm$^3$ or more.

3. A method of manufacturing an epitaxial wafer according to claim 1, wherein a crystal rotating speed is reduced to 10 rpm while said silicon single crystal is grown.

4. A method of manufacturing an epitaxial wafer according to claim 1, wherein a density of defects in said epitaxial layer is 0.1 piece/cm$^2$ or less.

5. A method of manufacturing an epitaxial wafer comprising a step of growing an epitaxial layer on a wafer sliced from a silicon single crystal which is doped with nitrogen and grown in such a manner that an inside diameter of an oxygen induced stacking fault ring region is located at a position which is 85% or more of a diameter of said wafer.

6. A method of manufacturing an epitaxial wafer according to claim 5, wherein an oxygen concentration in said wafer is 4×10$^{17}$ atoms/cm$^3$ or more.

7. A method of manufacturing an epitaxial wafer according to claim 5, wherein said single crystal is pulled in such a manner that a diameter of said single crystal being grown is larger than a diameter of said single crystal obtained when said single crystal is finished as a product.

8. A method of manufacturing an epitaxial wafer according to claim 5, wherein a boron concentration is less than $1\times10^{18}$ atoms/cm$^3$.

9. A method of manufacturing an epitaxial wafer according to claim 5, wherein a distance between a melt surface and a heat shielding material within a crucible is adjusted as a gap L.

10. A method of manufacturing an epitaxial wafer according to claim 5, wherein a density of defects in said epitaxial layer is 0.1 piece/cm$^2$ or less.

11. A method of manufacturing an epitaxial wafer comprising a step of growing an epitaxial layer on a wafer sliced from a silicon single crystal which is doped with nitrogen at a concentration between $1\times10^{12}$ atoms/cm$^3$ or more and $1\times10^{14}$ atoms/cm$^3$ or less and which is grown while pulled at a rate of 1.2 mm/min or higher.

12. A method of manufacturing an epitaxial wafer according to claim 11, wherein an oxygen concentration in said wafer is $4\times10^{17}$ atoms/cm$^3$ or more.

13. A method of manufacturing an epitaxial wafer according to claim 11, wherein said nitrogen is doped at a concentration of less than $1\times10^{13}$ atoms/cm$^3$.

14. A method of manufacturing an epitaxial wafer according to claim 11, wherein said silicon single crystal is grown while pulled at a rate of 1.8 mm/min or higher.

15. A method of manufacturing an epitaxial wafer according to claim 11, wherein a boron concentration is less than $1\times10^{18}$ atoms/cm$^3$.

16. A method of manufacturing an epitaxial wafer according to claim 11, wherein a density of defects in said epitaxial layer is 0.1 piece/cm$^2$ or less.

17. A method of manufacturing an epitaxial wafer comprising a step of growing an epitaxial layer on a wafer sliced from a silicon single crystal which is doped with nitrogen at a concentration between $1\times10^{12}$ atoms/cm$^3$ or more and less than $1\times10^{14}$ atoms/cm$^3$, said epitaxial layer being grown after said sliced wafer has been heat-treated at a temperature between 1200° C. and 1300° C. for 1 minute or more.

18. A method of manufacturing an epitaxial wafer according to claim 17, wherein an oxygen concentration in said wafer is $4\times10^{17}$ atoms/cm$^3$ or more.

19. A method of manufacturing an epitaxial wafer according to claim 17, wherein said nitrogen is doped at a concentration of less than $1\times10^{13}$ atoms/cm$^3$.

20. A method of manufacturing an epitaxial wafer according to claim 17, wherein a density of defects in said epitaxial layer is 0.1 piece/cm$^2$ or less.

* * * * *